(12) United States Patent
Hoffer et al.

(10) Patent No.: US 8,093,499 B2
(45) Date of Patent: Jan. 10, 2012

(54) CABLE MANAGEMENT SYSTEM

(75) Inventors: John Carey Hoffer, Harrisburg, PA (US); Kenneth Cameron Hall, Lafayette Hill, PA (US); Andrew Joseph Kinka, Lititz, PA (US); Shawn Phillip Tobey, Trinity, NC (US); James Shannon Hower, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 674 days.

(21) Appl. No.: 12/107,897

(22) Filed: Apr. 23, 2008

(65) Prior Publication Data

US 2009/0266607 A1 Oct. 29, 2009

(51) Int. Cl.
*H02G 3/04* (2006.01)

(52) U.S. Cl. .......... 174/72 A; 174/68.1; 174/68.3; 385/134; 385/135; 211/26; 248/68.1

(58) Field of Classification Search .......... 174/480, 174/481, 72 A, 72 C, 68.1, 68.3, 135, 74 R; 385/134, 135; 361/829, 826; 211/26; 312/223.1; 52/220.7; 248/68.1
See application file for complete search history.

(56) References Cited

U.S. PATENT DOCUMENTS

| | | | |
|---|---|---|---|
| 6,170,784 B1 | 1/2001 | MacDonald et al. | |
| 6,327,139 B1 | 12/2001 | Champion et al. | |
| 6,396,992 B1 * | 5/2002 | Debal | 385/135 |
| 6,568,542 B1 * | 5/2003 | Chen | 385/135 |
| 6,600,106 B2 * | 7/2003 | Standish et al. | 174/68.3 |
| 6,679,722 B1 * | 1/2004 | Pulizzi | 439/451 |
| 6,818,834 B1 * | 11/2004 | Lin | 174/68.3 |
| 7,091,418 B1 | 8/2006 | Clark et al. | |
| 7,200,931 B2 * | 4/2007 | Clark et al. | 174/72 A |
| 7,352,947 B2 * | 4/2008 | Phung et al. | 385/135 |
| 7,404,736 B2 * | 7/2008 | Herbst et al. | 439/557 |
| 7,510,421 B2 * | 3/2009 | Fransen et al. | 439/449 |
| 7,693,387 B2 * | 4/2010 | Weinegger et al. | 385/135 |
| 2004/0035983 A1 | 2/2004 | Simonson et al. | |
| 2005/0076479 A1 | 4/2005 | Rolla et al. | |

OTHER PUBLICATIONS

Stantron Audio/Video and Broadcast; Rack Mount Lacing Options; APW Mayville; www.StantronRacks.com; (1 page).

* cited by examiner

*Primary Examiner* — Angel R Estrada

(57) ABSTRACT

A cable management system for cable management in an equipment rack includes a support bracket having a body extending between a mounting end and a distal end. The mounting end is configured to attach to the equipment rack, and the body has a tie down slot configured to receive a cable tie down. A cable bar is coupled to the distal end of the support bracket, wherein the cable bar has a tie down slot configured to receive a cable tie down.

20 Claims, 7 Drawing Sheets

CABLE MANAGEMENT SYSTEM

CROSS REFERENCE TO RELATED APPLICATIONS

This application claims the benefit of U.S. Provisional Application No. 60/925,027 titled CABLE MANAGEMENT SYSTEM and filed Apr. 24, 2007, the subject matter of which is herein incorporated by reference in its entirety.

BACKGROUND OF THE INVENTION

The subject matter herein relates generally to cable management systems and, more particularly, to a cable management system for use in equipment racks.

Standard equipment cabinets or racks, such as data communications racks, are typically used to house a number of electrical components, switches, control panels and patch panels. Due to demands for increased capabilities, the panels are designed for an increasing quantity of connections. Once the panels are installed into the rack, the associated wires and cables are connected to the panels. The higher density panels have more connectors and consequently, more or larger associated cabling. In order to properly set-up the equipment rack and properly maintain the connectors, the cables must be installed in an organized manner.

Numerous problems exist with current cable management structures. For example, current horizontal support cable mangers are not robust enough to handle the size and weight of multi-conductor cables. Additionally, current systems do not provide the necessary strain relief for the cable and connector, and the cables may not be properly located when secured. Current systems do not support vertical strain relief or the transition from the horizontal to the vertical cable manager, and the size of the system limits the flexibility for use in different size racks. Additionally, current systems may be rack specific which further limits applications.

BRIEF DESCRIPTION OF THE INVENTION

In one embodiment, a cable management system is provided for cable management in an equipment rack. The cable management system includes a support bracket having a body extending between a mounting end and a distal end. The mounting end is configured to attach to the equipment rack, and the body has a tie down slot configured to receive a cable tie down. A cable bar is coupled to the distal end of the support bracket, wherein the cable bar has a tie down slot configured to receive a cable tie down.

Optionally, the support bracket and the cable bar define a cable support assembly, a plurality of cable support assemblies may be provided having support brackets of different lengths such that the cable bars are positioned at different depths from the equipment rack. The cable support assemblies may have a tiered arrangement. Optionally, the body is defined by a straight edge and a sloped edge extending between the mounting end and the distal end, wherein the support bracket may be attached to the equipment rack in a first orientation wherein the straight edge is downward facing and a second orientation wherein the straight edge is upward facing such that the cable bar is arranged at a different height when the support bracket is in the first orientation as compared to the second orientation. Optionally, the cable bar may be coupled to the support bracket in a first orientation or a second orientation, wherein the tie down slot of the cable bar extends along a first slot axis when the cable bar is coupled in the first orientation and the tie down slot of the cable bar extends along a second slot axis that is substantially perpendicular to the first slot axis when the cable bar is coupled in the second orientation. The cable bar may include a first leg and a second leg, wherein the tie down slot of the cable bar extending through the first leg. The cable bar may be oriented such that the first leg is substantially horizontal or such that the first leg is substantially vertical.

In another embodiment, a cable management system is provided for cable management in an equipment rack that includes a first support bracket configured to attach to the equipment rack, wherein the first support bracket has a body having a tie down slot configured to receive a cable tie down. A second support bracket is configured to attach to the equipment rack and includes a body having a tie down slot configured to receive a cable tie down. The cable management system also includes a cable bar that extends between a first end and a second end. The first end is coupled to the first support bracket and the second end is coupled to the second support bracket. The cable bar has a tie down slot configured to receive a cable tie down. At least one of the first end and the second end is removably coupled such that the cable bar may be moved to provide access to a rear of the equipment rack. The cable management system may include fasteners that removably couple the cable bar to the first and second support brackets.

Optionally, a first fastener may secure the first end to the first support bracket and a second fastener may secure the second end to the second support bracket, wherein when the first fastener is removed, the cable bar is configured to rotate about the second fastener to provide access to a rear of the equipment rack, and wherein when the first and second fasteners are removed, the cable bar is configured to be removed from the first and second support brackets to provide access to a rear of the equipment rack.

In a further embodiment, a cable management system is provided for cable management in an equipment rack that includes a first support bracket configured to attach to the equipment rack that has a body having a tie down slot configured to receive a cable tie down and a second support bracket configured to attach to the equipment rack that has a body having a tie down slot configured to receive a cable tie down. A cable bar having a tie down slot configured to receive a cable tie down is mountable to the first support bracket and the second support bracket in a first orientation such that the tie down slot is oriented substantially vertically, and the cable bar is mountable to the first support bracket and the second support bracket in a second orientation such that the tie down slot is oriented substantially horizontally.

Optionally, the cable bar may have first and second legs defining an L-shaped cross-section, wherein the tie down slot of the cable bar extends through the first leg. The first leg is arranged substantially horizontal in the first orientation and the first leg is arranged substantially vertical in the second orientation. Each of the first and second legs may include a mounting flange having a leg opening, and the first and second support brackets may each include an attachment flange with a bracket opening. The leg openings of the first leg may be aligned with the bracket openings of the first and second support brackets in the first orientation, and the leg openings of the second leg may be aligned with the bracket openings of the first and second support brackets in the second orientation. Optionally the cable bar may have a longitudinal axis extending along the first and second legs and a transverse axis extending through the first leg, wherein the cable bar is transferred from the first orientation to the second orientation by rotating the cable bar 180 degrees about the longitudinal axis and 90 degrees about the transverse axis.

DETAILED DESCRIPTION OF THE INVENTION

Figure 1:
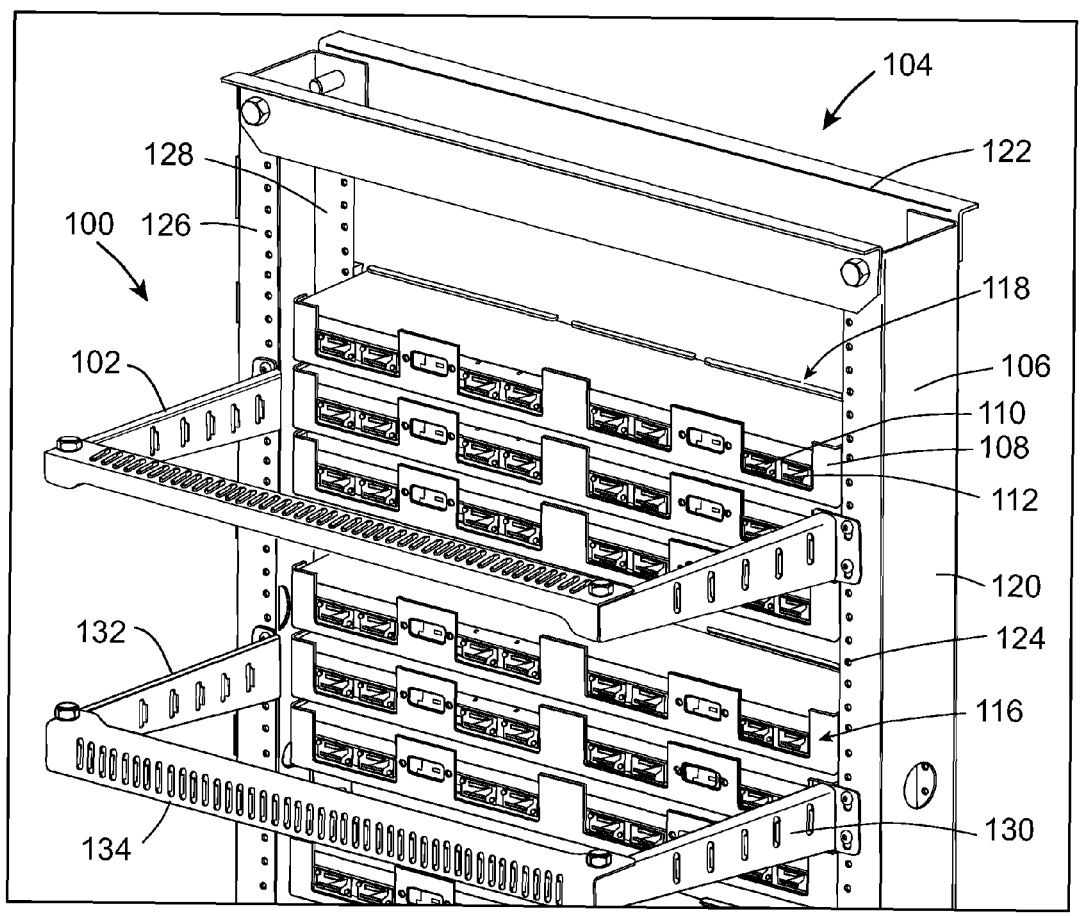
FIG. 1 is a rear perspective view of a cable management system having a plurality of cable support assemblies mounted to a distribution assembly.

FIG. 1 is a rear perspective view of a cable management system 100 having a plurality of cable support assemblies 102 mounted to a distribution assembly 104. In the illustrated embodiment, the distribution assembly 104 represents a switching network, however, the distribution assembly 104 is merely illustrative and the cable management system 100 may be used with other types of systems/components that distribute or interconnect cables. The cable management system 100 provides strain relief, cable organization, and mechanical stability. The cable management system 100 is a multi piece solution with variable mounting configurations that support both horizontal and vertical cable management combined into one system.

The distribution assembly 104 generally includes an equipment rack 106 and a plurality of patch panels 108 arranged in a stacked configuration. The patch panels 108 include electronic modules 110 having multiple connector ports 112. Cables 114 (shown in FIG. 4) are connected to the connector ports 112 at a rear interface 116 of the patch panels 108. The cables 114 may be grouped together as cable bundles and are routed generally behind the patch panels 108. The cables 114 are managed by the cable management system 100. Each patch panel 108 also receives other cables (not shown) at a front interface 118 of the patch panel 108. The equipment rack 106 includes a pair of posts 120 that are joined by a top plate 122. The patch panels 108 extend between and are coupled to the posts 120.

The cable management system 100 includes at least one cable support assembly 102. The cable support assemblies 102 are attached to the posts 120 of the equipment rack 106. For example, the posts 120 include mounting holes 124 on the rear flange 126 and/or the front flange 128 thereof. The mounting holes 124 have a predetermined spacing therebetween such that the cable support assemblies 102 may be mounted to any vertical location. In an exemplary embodiment, the cable support assemblies 102 fit into 1 U height requirements.

The cable support assemblies 102 generally include a first support bracket 130, a second support bracket 132 and a cable bar 134 extending therebetween. More or fewer support brackets 130, 132 and/or cable bars 134 may be provided in alternative embodiments. The support brackets 130, 132 are adjustably mounted to the equipment rack 106 and generally extend horizontally and rearwardly from the rear of the equipment rack 106. For example, the support brackets 130, 132 are adjustably attached to the posts 120 of the equipment rack 106 at adjustable locations to accommodate the specific cable support layout required. In an exemplary embodiment, as will be described in further detail below, the support brackets 130, 132 provide for cable support within the distribution assembly 104. The horizontal cable bar 134 provides a horizontal span between the first and second support brackets 130, 132 to provide for cable support within the distribution assembly 104.

Figure 2:
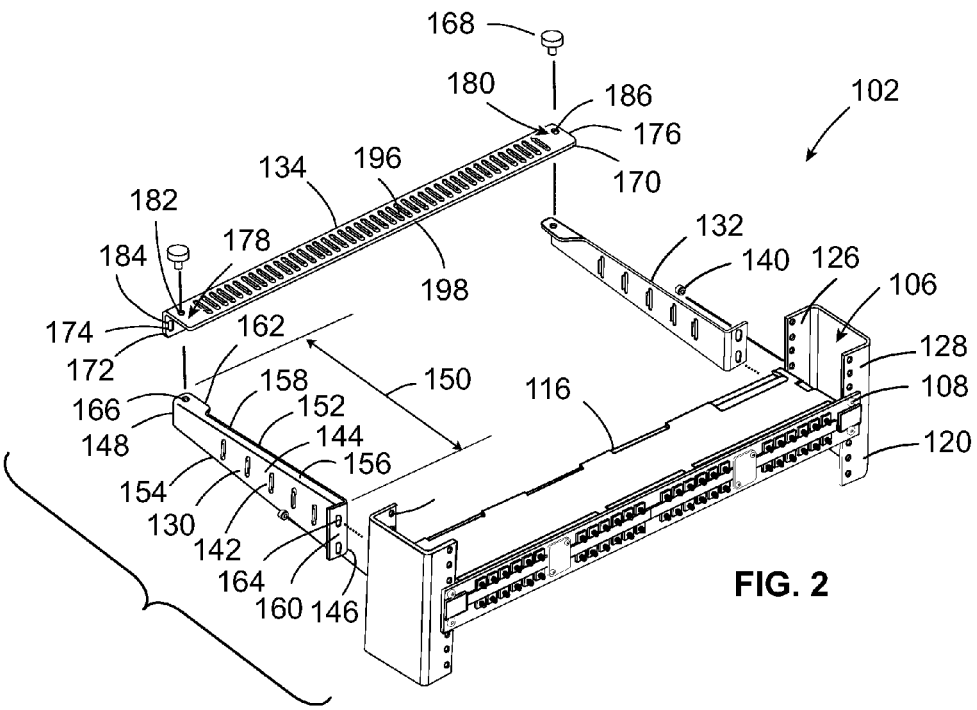
FIG. 2 is an exploded front perspective view of one of the cable support assemblies shown in FIG. 1 being assembled in accordance with an exemplary embodiment.

FIG. 2 is an exploded front perspective view of one of the cable support assemblies 102 being mounted to the equipment rack 106. One patch panel 108 is shown mounted to the front flanges 128 of the posts 120. The cable support assembly 102 is mounted to the rear flanges 126 of the posts 120, and is substantially vertically aligned with the patch panel 108, however, the cable support assembly 102 may be mounted at any vertical position along the posts 120. Fasteners 140 are used to secure the support brackets 130, 132 to the posts 120 separate from the patch panel 108.

The first support bracket 130 includes a body 142 having a center section 144 extending between a mounting end 146 and a distal end 148. When coupled to the equipment rack 106, the distal end 148 is cantilevered from the equipment rack 106. The body 142 has a length 150 that is selected such that the distal end 148 is at a depth from the rear interface 116. Optionally, different support brackets 130 having different lengths 150 may be provided and used with the cable management system 100.

The center section 144 of the body 142 is defined by a straight side 152 and a sloped side 154 that both extend between the mounting end 146 and the distal end 148. In an exemplary embodiment, the center section 144 has an L-shaped cross section, wherein a flange or lip 156 is provided at the straight side 152 and extends generally inwardly. The lip 156 provides rigidity to the center section 144 and may reduce bending or rotation of the center section 144 when the support bracket 130 is placed under load. Optionally the center section 144 may have a C-shaped cross-section with both the straight side 152 and the sloped side 154 having a flange or lip. The sloped side 154 is non-parallel with the straight side 152 and is generally converging toward the straight side 152 from the mounting end 146. As such, the center section 144 is wider at the mounting end 146 than at the distal end 148. In an exemplary embodiment, the support bracket 130 is mounted to the equipment rack 106 such that the straight side 152 defines a top side of the support bracket 130. In an alternative embodiment, the support bracket 130 is mounted to the equipment rack 106 such that the straight side 152 defines a bottom side of the support bracket 130. Such mounting options provide more flexibility in the location of the mounting of the support bracket 130. Additionally particularly when closely spacing support brackets 130, the sloped nature of the sloped side 154 provides access or clearance between adjacent support brackets 130, particularly proximate the distal ends 148 for cables and/or a persons hand or tool to install or remove the cable bar 134.

In an exemplary embodiment, the center section 144 of the support bracket 130 includes a plurality of tie down slots 158. The tie down slots 158 are generally vertically oriented and are sized and shaped to receive cable tie downs 200 (shown in FIG. 4) to position and/or secure the cables 114 to the support bracket 130. The tie down slots 158 are spaced apart from one another to define different tie down depths from the rear interface 116 of the patch panel 108. In an alternative embodiment, the tie down slots 158 may be oriented non-vertically, such as horizontally or at an angle between vertical and horizontal. The tie down slots 158 allows the cables 114 to be supported and organized along the vertical sides of the equipment rack 106 on the sides of the support bracket 130.

The first support bracket 130 includes a rack mounting tab 160 at the mounting end 146 and a rear attachment flange 162 at the distal end 148. The rack mounting tab 160 extends generally perpendicular from the body 142. The rack mounting tab 160 is generally outwardly flared. Tab holes 164 are provided in the rack mounting tab 160 and are aligned with the mounting holes 124 in the post 120. Optionally, the tab holes 164 may be vertically elongated such that the vertical position of the support bracket 130 may be adjusted, such as to align the tab holes 164 with the mounting holes 124. The fasteners 140 extend through the tab holes 164 and the mounting holes 124 to secure the support bracket 130 to the post 120.

The rear attachment flange 162 extends along the straight side 152 of the center section 144 proximate to the distal end 148. The rear attachment flange 162 extends generally perpendicular from the center section 144 and is generally inwardly flared. The cable bar 134 is attached to the rear attachment flange 162. In an exemplary embodiment the rear attachment flange 162 includes a bracket opening 166 extending therethrough.

The second support bracket 132 is substantially similar to the first support bracket 130, and like components will hereinafter be designated with like reference numerals. In an exemplary embodiment, the second support bracket 132 is a mirror image of the first support bracket 130.

The cable bar 134 is mounted to the rear attachment flanges 162 of the support brackets 130, 132, such as by using fasteners 168. FIG. 2 illustrates the cable bar 134 mounted in a first orientation or configuration. While the fasteners 168 are illustrated in FIG. 2 as thumb screws, other types of fasteners may be used in alternative embodiments to securely couple the cable bar 134 to the support brackets 130, 132. For example, the fastener may be a rivet, a pin, a bolt, a clamp, a tie-down, and the like. The cable bar 134 is removably coupled to the support brackets 130, 132, such as by releasing or removing the fasteners 168. Alternatively, the cable bar 134 may be permanently coupled to the support brackets 130, 132, such as by welding. In one alternative embodiment the cable bar 134, is integrally formed with at least one of the support brackets 130, 132.

The cable bar 134 has a generally L-shaped cross-section and includes a first leg 170 and a second leg 172 that extends generally perpendicularly from the first leg 170. The cable bar 134 extends between a first end 174 and a second end 176. In one orientation, the first end 174 is attached to the first support bracket 130 and the second end 176 is attached to the second support bracket 132. The cable bar 134 includes a first mounting flange 178 at the first end 174 and a second mounting flange 180 at the second end 176. The mounting flanges 178, 180 extend along both legs 170, 172. The first mounting flange 178 includes a first leg opening 182 through the first leg 170 and a second leg opening 184 through the second leg 172. Similarly the second mounting flange 180 includes a first leg opening 186 through the first leg 170 and a second leg opening 188 (shown in FIG. 3) through the second leg 172.

When assembled in the first orientation, as illustrated in FIG. 2, the first leg opening 182 at the first end 174 is aligned with the bracket opening 166 in the first support bracket 130. The fastener 168 extends through the first leg opening 182 and the bracket opening 166 to securely couple the first end 174 of the cable bar 134 to the first support bracket 130. Similarly in the first orientation, the first leg opening 186 at the second end 176 is aligned with the bracket opening 166 in the second support bracket 132. The fastener 168 extends through the first leg opening 186 and the bracket opening 166 to securely couple the second end 174 of the cable bar 134 to the second support bracket 132.

A plurality of tie down slots 196 extend through the first leg 170. The tie down slots 196 are elongated in the direction from the second leg 172 to an edge 198 of the first leg 170. The tie down slots 196 are sized and shaped to receive cable tie downs (shown in FIG. 4) to position and/or secure the cables 114 to the cable bar 134. The tie down slots 196 are spaced apart from one another to define different tie down locations that are aligned with different areas of the rear interface 116 of the patch panel 108. The tie down slots 196 provide for using a tie down 200 (shown in FIG. 4) to attach one or more cables 114 to provide strain relief, support and organization for the cables 114 and the cable bundles. In the illustrated embodiment, when the cable bar 134 is mounted to the support brackets 130, 132 in the first orientation, the tie down slots 196 are oriented generally horizontally along a horizontal plane defined by the first leg 170.

Figure 3:
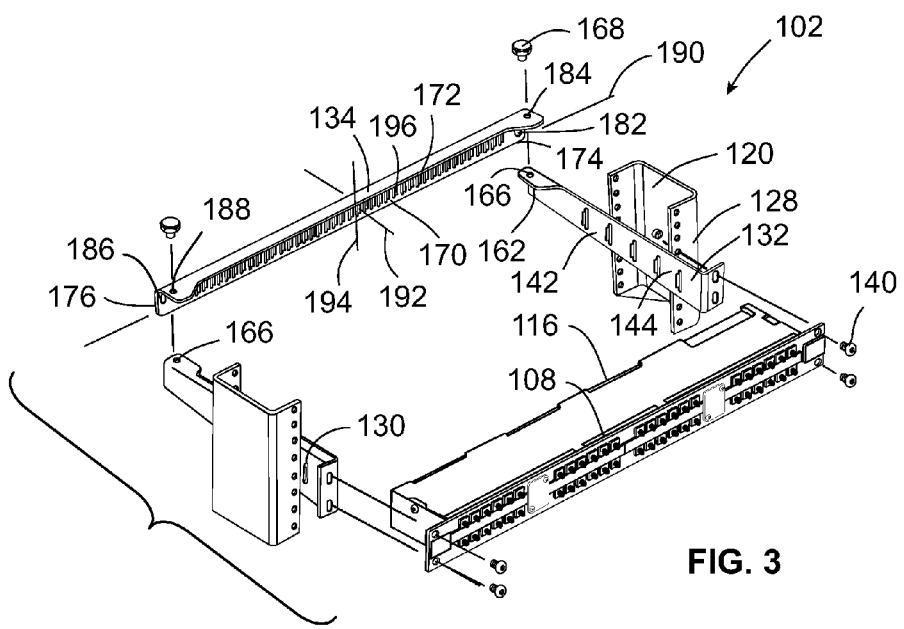
FIG. 3 is an exploded front perspective view of one of the cable support assemblies being assembled in accordance with an alternative embodiment.

FIG. 3 is an exploded front perspective view of the same cable support assembly 102 illustrated in FIG. 2, but being assembled differently than in the embodiment shown in FIG. 2. The cable support assembly 102 is attached to front flanges 128 of the posts 120. The same fasteners 140 are used to secure the patch panel 108 and the support brackets 130, 132. When assembled, the rear attachment flanges 162 of the support brackets 130, 132 are located at a different, shallower, depth from the rear interface 116 of the patch panel 108, as compared to the embodiment shown in FIG. 2, as at least a portion of the patch panel 108 extends along the body 142.

The cable bar 134 is attached to the support brackets 130, 132 in a second orientation or configuration. The second orientation is generally flipped with respect to the first orientation such that the tie down slots 196 are oriented substantially vertically as opposed to horizontally as in the first orientation. In the second orientation, the first leg 170 is oriented generally vertically and the second leg 172 is oriented generally horizontally. In the second orientation, the first end 174 is attached to the second support bracket 132 and the second end 176 is attached to the first support bracket 130.

The cable bar 134 includes a longitudinal axis 190 extending along the first and second legs 170, 172. The first and second legs 170, 172 are parallel to the longitudinal axis 190. A first transverse axis 192 extends through the first leg 170 and is perpendicular to the longitudinal axis 190. The second leg 172 is parallel to the first transverse axis 192. A second transverse axis 194 extends through the second leg 172 and is perpendicular to the longitudinal axis 190 and the first transverse axis 192. The first leg 170 is parallel to the second transverse axis 194. To transition from the first orientation to the second orientation, the cable bar 134 may be rotated about the longitudinal axis 190 approximately 180 degrees and the cable bar 134 may be rotated about one of the transverse axes 192, 194 approximately 90 degrees to transition the cable bar 134 from the first orientation to the second orientation, and vice versa.

When assembled in the second orientation, as illustrated in FIG. 3, the second leg opening 184 at the first end 174 is aligned with the bracket opening 166 in the second support bracket 132. The fastener 168 extends through the first leg opening 184 and the bracket opening 166 to securely couple the first end 174 of the cable bar 134 to the second support bracket 132. Similarly, in the second orientation, the second leg opening 188 at the second end 176 is aligned with the bracket opening 166 in the first support bracket 130. The fastener 168 extends through the second leg opening 188 and the bracket opening 166 to securely couple the second end 176 of the cable bar 134 to the first support bracket 130.

The leg openings 182, 184, 186 and 188 allow the cable bar 134 to be mounted to the support brackets 130, 132 in either the first orientation (shown in FIG. 2) or in the second orientation (shown in FIG. 3). For example, in the first orientation the first leg 170 is the horizontal leg and the second leg 172 is the vertical leg. In the second orientation, the first leg 170 is the vertical leg and the second leg 172 as the horizontal leg. Thus, the tie down slots 196 in the first leg 170 may be located on the top surface of the mounted horizontal cable bar 134 or the rear surface of the horizontal cable bar 134. The flexible mounting scheme of the cable bar 134 provides both horizontal and vertical strain relief and management and, provides both top and back attachment of the cables providing easy access to the electrical equipment or panels for installation and removal of the cables during replacement or trouble shooting.

Each of the components of the cable support assemblies 102 may include features, such as plates, tags, or other means for labeling cables and cable bundles to provide further organization within the equipment rack.

Figure 4:
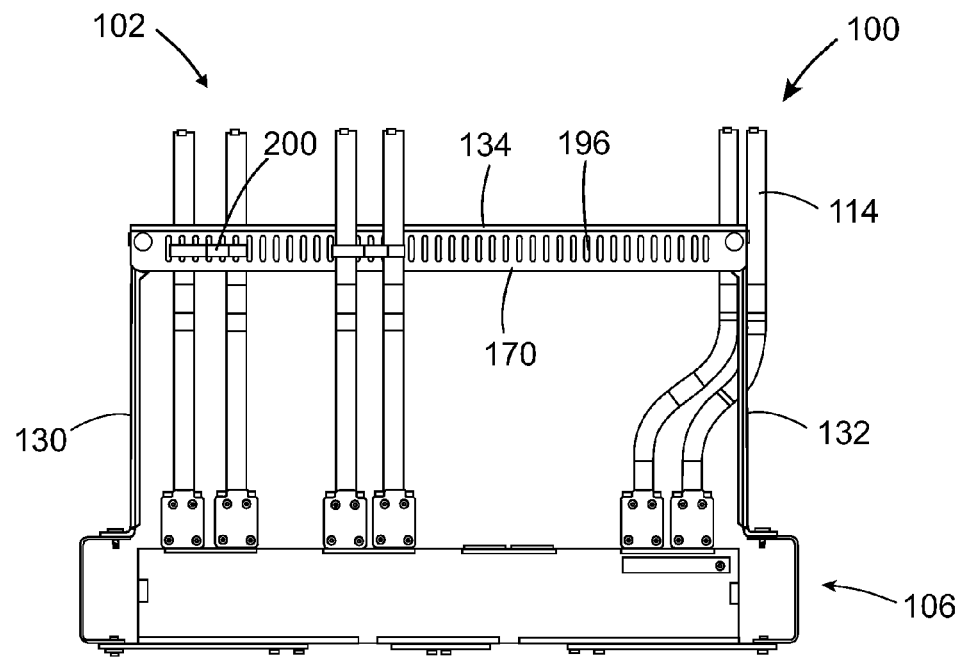
FIG. 4 is a top view of the cable management system and distribution assembly shown in FIG. 1 with a plurality of cables secured to the cable support assemblies.

FIG. 4 is a top view of the cable management system 100 and equipment rack 106 with a plurality of cables 114 secured to the cable support assemblies 102. The cable bar 134 is coupled to the support brackets 130, 132 such that the first leg 170 and the tie down slots 196 are oriented horizontally. Some of the cables 114 are secured to the top of the cable bar 134, while some of the cables 114 are secured to the bottom of the cable bar 134. For example, tie downs 200 extend through the tie down slots 196 and wrap around the cables 114 to secure the cables against the cable bar 134. The tie downs 200 may be plastic strips that are self-securing, such as zip ties, tie wraps, straps, clips, and the like. Alternatively, the tie downs 200 may be a strap, such as of a cloth material, having a fastener at least one of the ends, such as a hook and loop fastener. In the illustrated embodiment, some of the cables 114 are secured to the second support bracket 132 rather than the cable bar 134. Tie downs 200 are again used to extend through the tie down slots 158 (shown in FIG. 2) to secure the cables 114 to the support bracket 132. Optionally, the cables 114 may be run along either the inside or the outside of the support bracket 132.

Figure 5:
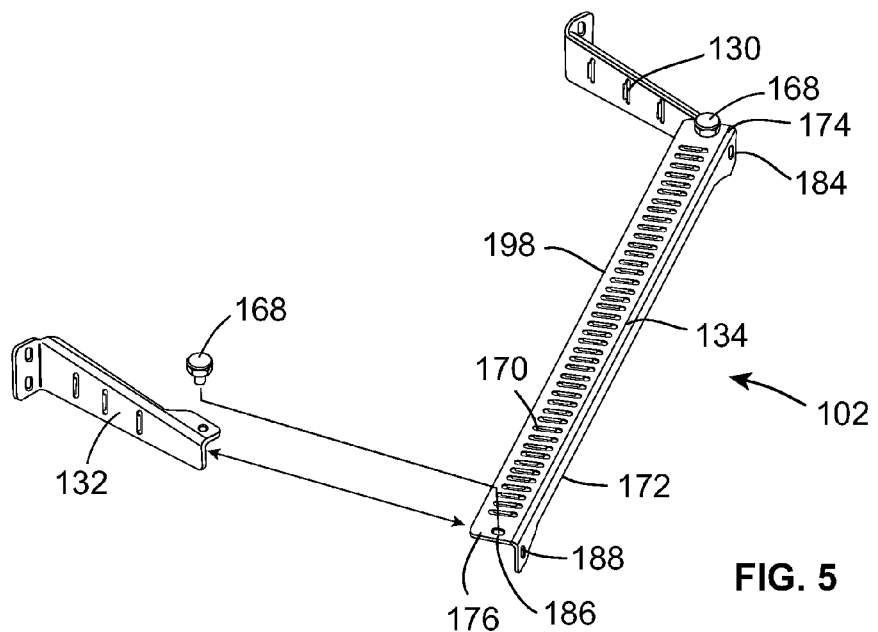
FIG. 5 is a rear perspective view of one of the cable support assemblies shown in FIG. 1 in a partially opened state.

FIG. 5 is a rear perspective view of one of the cable support assemblies 102 in a partially opened state. In an exemplary embodiment, the cable bar 134 may be moved to provide access to the rear interface 116 (shown in FIG. 1) of the equipment rack 106 (shown in FIG. 1). In one embodiment, the cable bar 134 may be rotated about either the first end 174 or the second end 176, such as by removing one of the fastener 168, such as the fastener securing the second end 176 to the second support bracket 132. Once the fastener 168 is released or removed, the cable bar 134 may be pivoted or rotated about the fastener 168 securing the first end 174 to the first support bracket 130. Once moved, the rear interface 116 may be accessed. In an alternative embodiment rather than pivoting, the entire cable bar 134 may be removed from the support brackets 130, 132. For example, both fasteners 168 may be released or removed and then the cable bar 134 may be removed. Once removed, the rear interface 116 may be accessed.

In an exemplary embodiment the leg openings 182 and 188 are elongated in the direction from the second leg 172 to the edge 198 of the first leg 170. Once one of the fasteners 168 is removed, to facilitate movement of the cable bar 134, the cable bar 134 is first moved or translated in a rearward direction, wherein the cable bar 134 is slid along the fastener 168. The position of the fastener 168 within the elongated opening 182 (shown in FIG. 2) is changed. Such movement provides clearance between the first end 174 of the cable bar 134 and the distal end 148 of the support bracket 130. The clearance allows the cable bar 134 to be rotated about the fastener 168.

Figure 6:
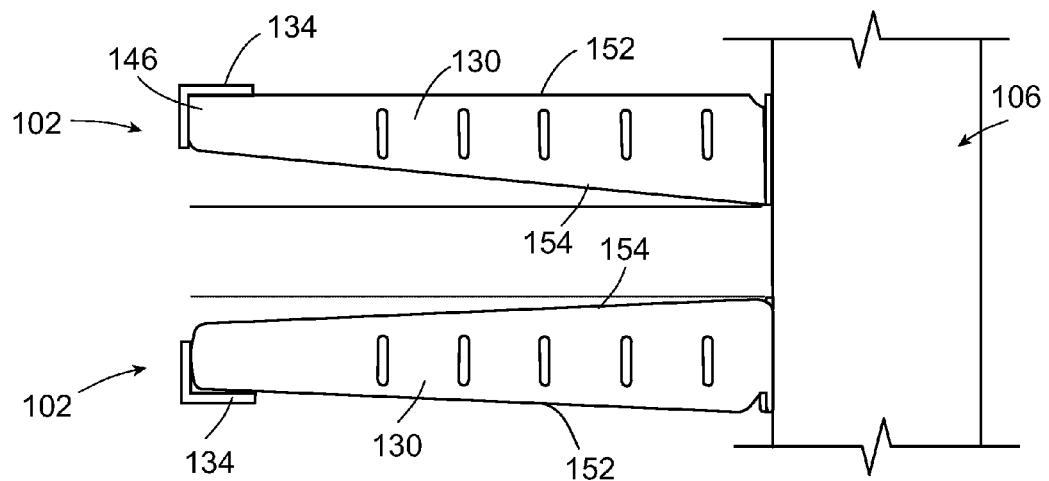
FIG. 6 is a side view of two of the cable support assemblies in different mounted orientations.

FIG. 6 is a side view of two of the cable support assemblies 102 in different mounted orientations. The upper cable support assembly 102 is normally mounted to the equipment rack 106, while the lower cable support assembly 102 is reverse, or upside-down, mounted to the equipment rack 106. When normally mounted, the straight side 152 is the top of the support bracket 130 and the sloped side 154 is the bottom of the support bracket 130. When upside-down mounted, the sloped side 154 is the top of the support bracket 130 and the straight side 152 is the bottom of the support bracket 130.

The cable bars 134 are attached to the straight sides 152 of support brackets 130. By mounting the support brackets 130 in different mounted orientations, the vertical positions of the cable bars 134 can be controlled. For example, in the normally mounted position, the cable bar 134 is generally aligned with the top of the mounting end 146, whereas in the reverse mounted position, the cable bar 134 is generally aligned with the bottom of the mounting end 146. As such, the cable bars 134 may be further spaced from one another as compared to a situation in which both cable support assemblies 102 are mounted in the same orientation. Such mounting options provides more flexibility in the location of the supporting elements for the cables 114 (shown in FIG. 4).

Figure 7:
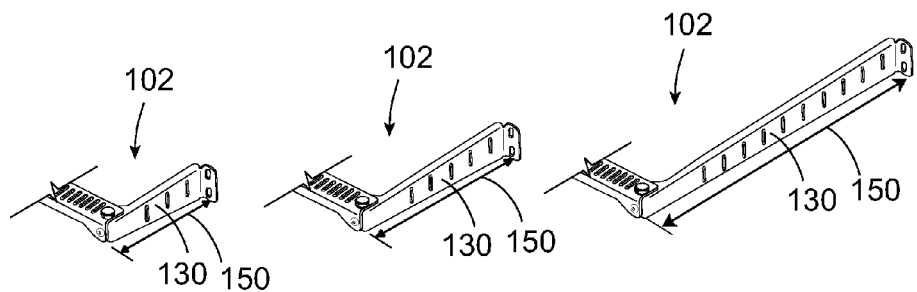
FIG. 7 illustrates an exemplary group of cable support assemblies.
Figure 9:
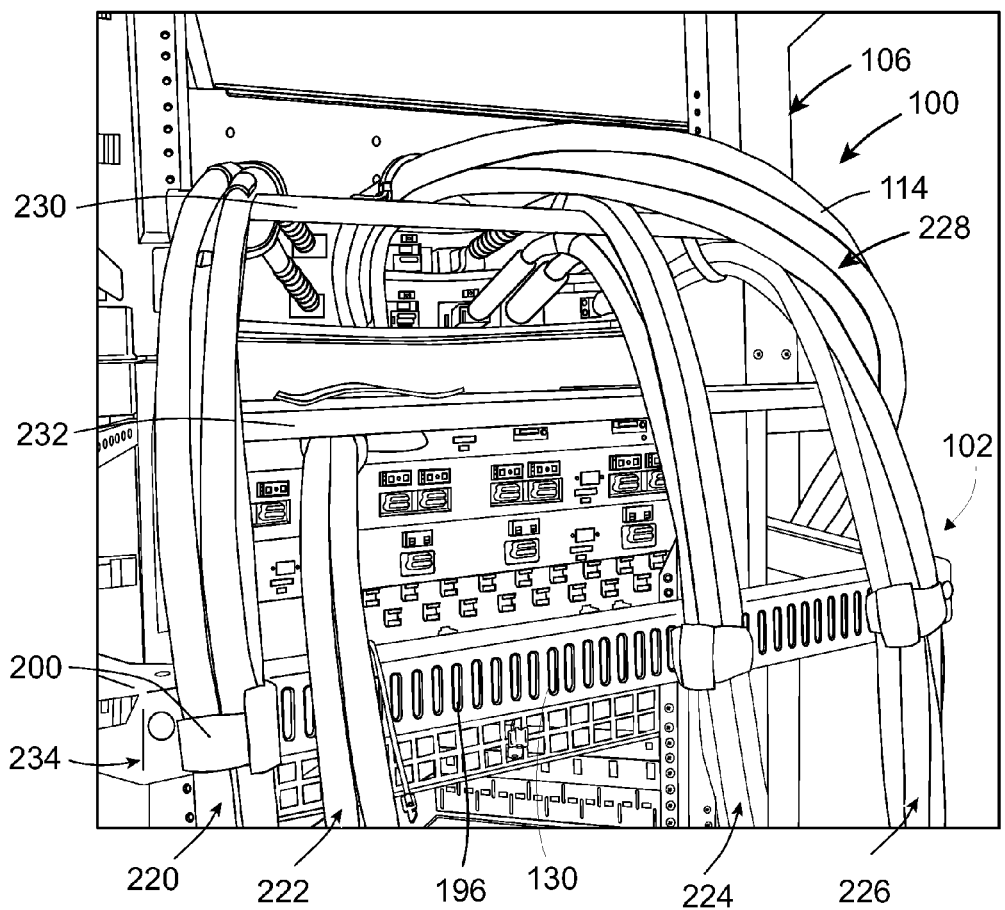
FIG. 9 is a partial rear view of the cable management system and distribution assembly with a plurality of cables secured to the cable support assemblies.
Figure 10:
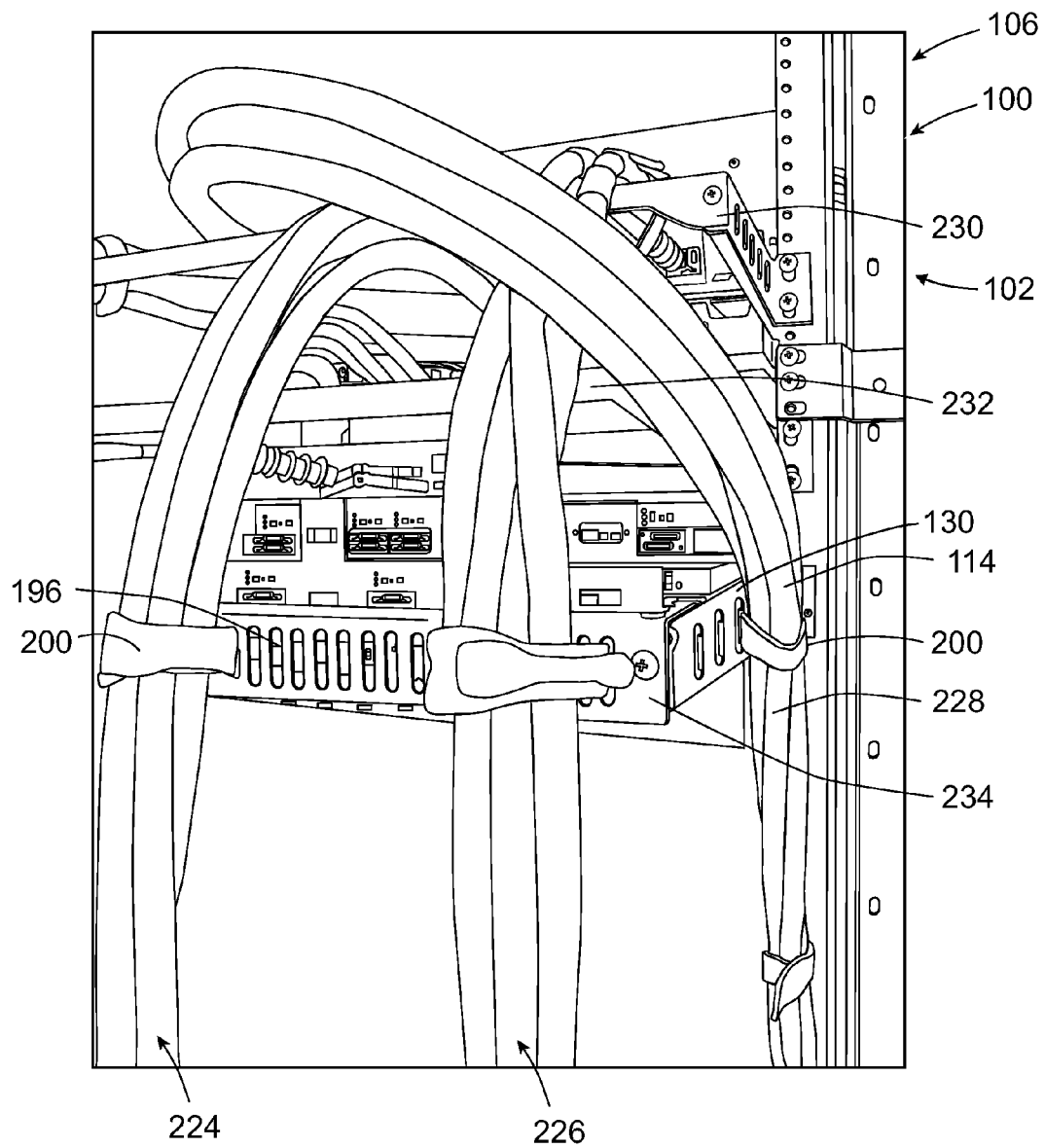
FIG. 10 is a partial rear perspective view of the cable management system and distribution assembly shown in FIG. 9.
Figure 11:
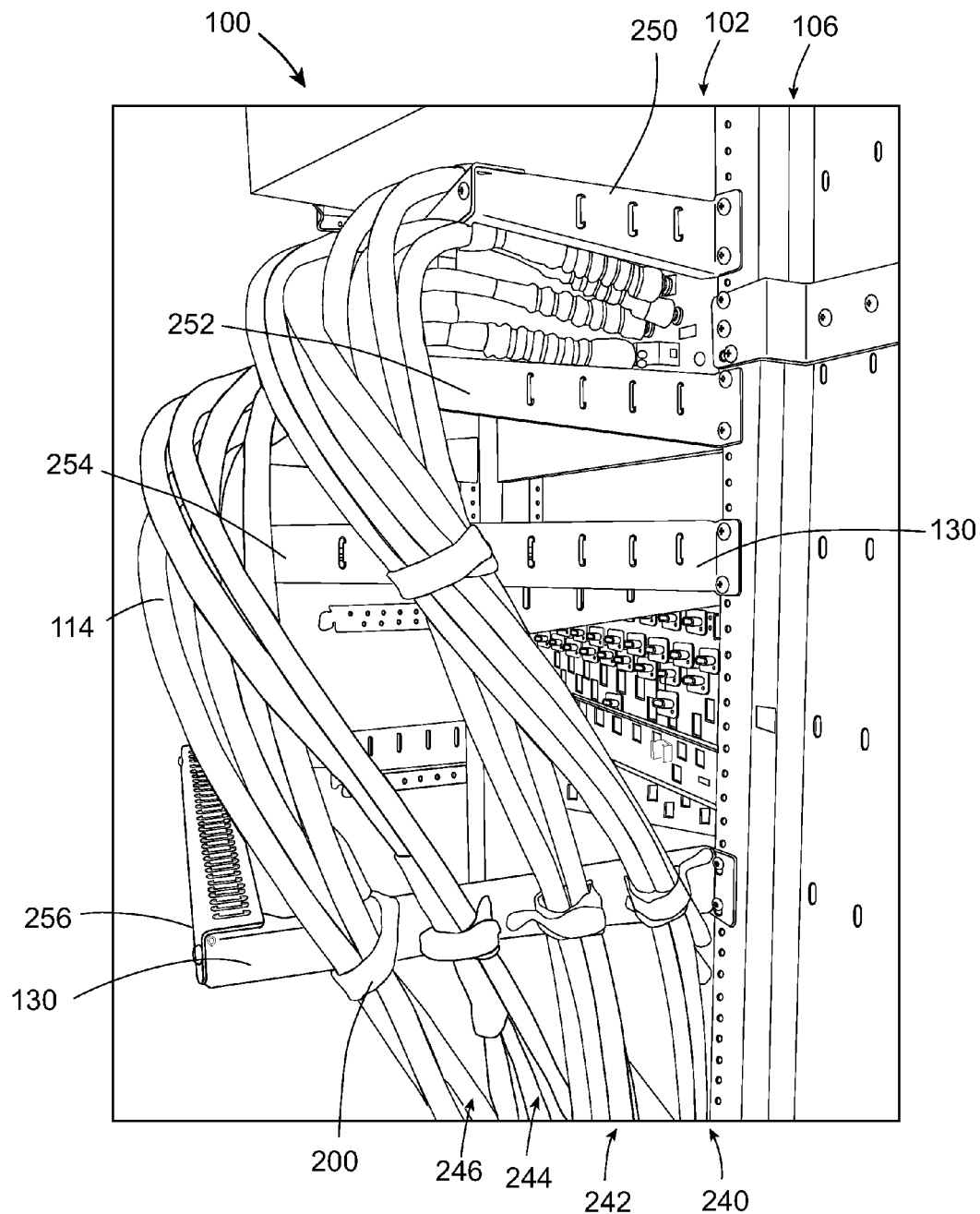
FIG. 11 is a partial side perspective view of the cable management system and distribution assembly in accordance with another embodiment.

FIG. 7 illustrates an exemplary group of cable support assemblies 102. FIG. 7 illustrates that different sized support brackets 130 may be provided. For example, the center sections 144 of the support brackets 130 may have different lengths 150. FIG. 7 illustrates three different sized support brackets 130 having center section lengths 150 of for example, six inches, nine inches, and twelve inches. However, support brackets 130 of any length may be used, including support brackets 130 having lengths longer than twelve inches or shorter than six inches. The variable length of the support brackets 130 provides for variable depths of the cable support assemblies 102 when used together and mounted to the equipment rack 106 (shown in FIG. 1). For example, one cable support assembly 102 may have a support bracket 130 with a length 150 of six inches, cable support assembly 102 may have a support bracket 130 with a length 150 of nine inches and a further cable support assembly 102 may have a support bracket 130 with a length 150 of twelve inches. When used together, the cable management system 100 (shown in FIG. 1) may have a tiered arrangement, some examples of which are shown in FIGS. 9-11.

Figure 8:
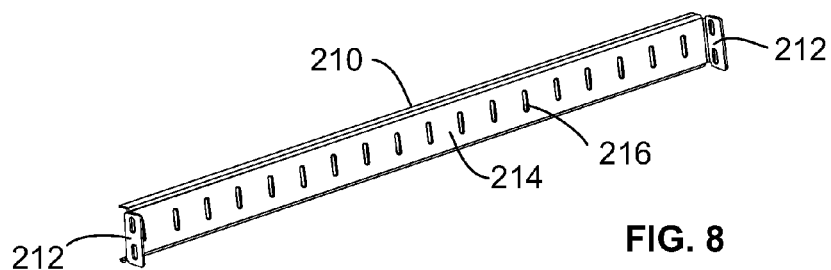
FIG. 8 is a side perspective view of a post support bar for use with a four post equipment rack.

FIG. 8 is a side perspective view of a post support bar 210 for use with a four post equipment rack (not shown). The post support bar 210 mounts substantially horizontally between two posts within the four post equipment rack and may be mounted in any vertical location in standard equipment racks.

In an exemplary embodiment, the post support bar 210 mounts between a front post and a back post of a four post equipment rack to provide post support and/or cable support on the sides of the equipment rack.

The post support bar 210 includes mounting flanges 212 at each end thereof and a spanning section 214 between the mounting flanges 212. The spanning section 214 has a C-shaped cross-section. The spanning section 214 includes a plurality of tie down slots 216 for placement of tie downs 200 (shown in FIG. 4) to support cables 114 (shown in FIG. 4). Optionally, the tie down slots 216 may be substantially vertically oriented. The post support bar 210 provides support and organization of vertical cable runs without impeding installation of the cable support assemblies 102 (shown in FIG. 1) and additional cables 114.

FIG. 9 is a partial rear view of the cable management system 100 and equipment rack 106 with a plurality of cables 114 secured to the cable support assemblies 102. FIG. 10 is a partial rear perspective view of the cable management system 100 and equipment rack 106 shown in FIG. 9. In the illustrated embodiment of FIGS. 9 and 10, five cable bundles are shown, wherein each cable bundle includes more than one cable 114. The cable bundles are identified as cable bundles 220, 222, 224, 226 and 228.

In the illustrated embodiment of FIGS. 9 and 10, three cable support assemblies are shown. The cable support assemblies are identified as cable support assemblies 230, 232 and 234. Each cable support assembly 230, 232 and 234 is sized differently. For example, the first, or upper, cable support assembly 230 has support brackets with a length of six inches. The second, or middle, cable support assembly 232 has support brackets with a length of nine inches. The third, or lower, cable support assembly 234 has support brackets with a length of twelve inches. The cable support assemblies thus provide a tiered approach for cable management. The cable bars of the upper and middle cable support assemblies 230, 232 are in a first orientation such that the tie down slots 196 are horizontally oriented. The cable bar of the lower cable support assembly 234 is in a second orientation such that the tie down slots 196 are vertically oriented.

The first cable bundle 220 is secured to the cable bar of the lower cable support assembly 234 using a tie down 200. All of the cables 114 in the first cable bundle 220 extend along the outside of the cable bar. The first cable bundle 220 is also secured to the cable bar of the upper cable support assembly 230 using another tie down 200. Some of the cables 114 in the first cable bundle 220 extend along the top of the cable bar and some of the cables 114 in the first cable bundle 220 extend along the bottom of the cable bar.

The second cable bundle 222 is secured to the cable bar of the middle cable support assembly 232 using a tie down 200. All of the cables 114 in the second cable bundle 222 extend along the bottom of the cable bar.

The third cable bundle 224 is secured to the cable bar of the lower cable support assembly 234 using a tie down 200. All of the cables 114 in the third cable bundle 224 extend along the outside of the cable bar. The third cable bundle 224 is also secured to the cable bar of the upper cable support assembly 230 using another tie down 200. Some of the cables 114 in the third cable bundle 224 extend along the top of the cable bar and some of the cables 114 in the third cable bundle 224 extend along the bottom of the cable bar. The fourth cable bundle 226 is secured in a similar manner as the third cable bundle 224.

The fifth cable bundle 228 is secured to the bracket support 130 of the lower cable support assembly 234 using a tie down 200. All of the cables 114 in the fifth cable bundle 228 extend along the outside of the bracket support 130. The fifth cable bundle 228 is also secured to the cable bar of the upper cable support assembly 230 using another tie down 200. All of the cables 114 in the fifth cable bundle 228 extend along the top of the cable bar.

The cable management system 100 thus provides strain relief, cable organization, and mechanical stability. The various mounting configurations of the cable tie downs 200 support both horizontal and vertical cable management combined into one system. The support brackets may be adjustably attached to the equipment rack 106 at adjustable locations to accommodate the specific cable support layout required.

FIG. 11 is a partial side perspective view of the cable management system 100 and equipment rack 106 having a different arrangement of cable support assemblies 102 and cables 114 than the embodiment illustrated in FIGS. 9 and 10. In the illustrated embodiment of FIG. 11, four cable bundles are shown, wherein each cable bundle includes more than one cable 114. The cable bundles are identified as cable bundles 240, 242, 244 and 246.

In the illustrated embodiment of FIG. 11, four cable support assemblies are shown. The cable support assemblies are identified as cable support assemblies 250, 252, 254 and 256. The cable support assemblies 254 and 256 are sized the same as one another, but are sized differently than the cable support assemblies 250 and 252. For example, the first, or upper, cable support assembly 250 has support brackets with a length of six inches. The second, or upper-middle, cable support assembly 252 has support brackets with a length of nine inches. The third, or lower-middle, cable support assembly 254 and the fourth, or lower, cable support assembly 256 both have support brackets with a length of twelve inches. The cable support assemblies thus provide a tiered approach for cable management.

Each of the cable bundles 240, 242, 244 and 246 are secured to the support bracket 130 of the lower cable support assembly 256 using tie downs 200. The first and second cable bundles 240, 242 are both secured to the support bracket 130 of the lower-middle cable support assembly 254 using a common tie down 200.

The cable management system 100 thus provides strain relief, cable organization, and mechanical stability. The various mounting configurations of the cable ties 200 support both horizontal and vertical cable management combined into one system. The support brackets may be adjustably attached to the equipment rack 106 at adjustable locations to accommodate the specific cable support layout required.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable management system for cable management in an equipment rack, the cable management system comprising:
   a first support bracket configured to attach to the equipment rack, the first support bracket having a body having a tie down slot configured to receive a cable tie down;
   a second support bracket configured to attach to the equipment rack, the second support bracket having a body having a tie down slot configured to receive a cable tie down; and
   a cable bar extending between a first end and a second end, the first end being coupled to the first support bracket and the second end being coupled to the second support bracket, the cable bar having a tie down slot configured to receive a cable tie down, wherein at least one of the first end and the second end is removably coupled to the first support bracket or the second support bracket, respectively, such that the cable bar may be moved to provide access to a rear of the equipment rack;
   wherein the cable bar is configured to be coupled to the first and second support brackets in a first orientation and a second orientation, wherein the tie down slot of the cable bar extends along a first slot axis when the cable bar is coupled in the first orientation and the tie down slot of the cable bar extends along a second slot axis that is substantially perpendicular to the first slot axis when the cable bar is coupled in the second orientation.

2. The cable management system of claim 1, further comprising fasteners that removably couple the cable bar to the first and second support brackets.

3. The cable management system of claim 1, further comprising a first fastener securing the first end to the first support bracket and a second fastener securing the second end to the second support bracket, wherein when the first fastener is removed, the cable bar is configured to rotate about the second fastener to provide access to a rear of the equipment rack, and wherein when the first and second fasteners are removed, the cable bar is configured to be removed from the first and second support brackets to provide access to a rear of the equipment rack.

4. The cable management system of claim 1, wherein the first support bracket includes a bracket opening and the cable bar includes an elongated leg opening proximate the first end, a fastener is received in the bracket opening and the leg opening to couple the first end to the first support bracket, wherein when the cable bar is moved to an open position, the cable bar is first moved rearward to change the relative position of the leg opening and the fastener and then the cable bar is rotated about the fastener.

5. The cable management system of claim 1, wherein the first support bracket, second support bracket and the cable bar define a cable support assembly, a plurality of cable support assemblies are provided having a tiered arrangement.

6. A cable management system for cable management in an equipment rack, the cable management system comprising:
   a support bracket having a body extending between a mounting end and a distal end, the mounting end configured to attach to the equipment rack, the body having a tie down slot configured to receive a cable tie down; and
   a cable bar coupled to the distal end of the support bracket, the cable bar having a tie down slot configured to receive a cable tie down;
   wherein the support bracket and the cable bar define a cable support assembly, a plurality of cable support assemblies are provided having a tiered arrangement.

7. The cable management system of claim 6, wherein the plurality of cable support assemblies have support brackets of different lengths such that the cable bars are positioned at different depths from the equipment rack.

8. The cable management system of claim 6, wherein the body is defined by a straight side and a sloped side extending between the mounting end and the distal end, the support bracket being attached to the equipment rack in a first orientation wherein the straight side is downward facing and a second orientation wherein the straight side is upward facing, the cable bar being arranged at a different height when the support bracket is in the first orientation as compared to the second orientation.

9. The cable management system of claim 6, wherein the cable bar is configured to be coupled to the support bracket in a first orientation and a second orientation, wherein the tie down slot of the cable bar extends along a first slot axis when the cable bar is coupled in the first orientation and the tie down slot of the cable bar extends along a second slot axis that is substantially perpendicular to the first slot axis when the cable bar is coupled in the second orientation.

10. The cable management system of claim 6, wherein the cable bar includes a first leg and a second leg, the tie down slot of the cable bar extending through the first leg, the cable bar is configured to be oriented in a first orientation such that the first leg is substantially horizontal and the cable bar is configured to be oriented in a second orientation such that the first leg is substantially vertical.

11. The cable management system of claim 6, wherein the equipment rack has a flange, the cable bar is configured to be oriented in a first orientation such that the tie down slot of the cable bar is substantially perpendicular to the flange and the cable bar is configured to be oriented in a second orientation such that the tie down slot of the cable bar is substantially parallel to the flange.

12. The cable management system of claim 6, wherein the equipment rack has a flange, the tie down slots of the support bracket being elongated in a direction substantially parallel to the flange.

13. The cable management system of claim 6, wherein the support bracket includes a mounting tab at the mounting end, the mounting tab is configured to be attached to at least one of a front flange of the equipment rack or a rear flange of the equipment rack to change a depth of the cable bar from the rear of the equipment rack.

14. The cable management system of claim 6, wherein the cable bar includes first and second legs each including a mounting flange having a leg opening, and wherein the distal end of the support bracket includes an attachment flange having a bracket opening, one of the leg openings being aligned with the bracket opening for receiving a fastener.

15. The cable management system of claim 6, wherein the equipment rack includes four posts in a rectangular configuration, the cable management system further comprising a post support bar extending generally horizontally between two of the posts, the post support bar having a tie down slot configured to receive a cable tie down.

16. A cable management system for cable management in an equipment rack, the cable management system comprising:
- a first support bracket configured to attach to the equipment rack, the first support bracket having a body having a tie down slot configured to receive a cable tie down;
- a second support bracket configured to attach to the equipment rack, the second support bracket having a body having a tie down slot configured to receive a cable tie down; and
- a cable bar having a tie down slot configured to receive a cable tie down, the cable bar being mountable to the first support bracket and the second support bracket in a first orientation such that the tie down slot is oriented substantially horizontally, and the cable bar being mountable to the first support bracket and the second support bracket in a second orientation such that the tie down slot is oriented substantially vertically.

17. The cable management system of claim 16, wherein the cable bar has first and second legs defining an L-shaped cross-section, wherein the tie down slot of the cable bar extends through the first leg, the first leg is arranged substantially horizontal in the first orientation and the first leg is arranged substantially vertical in the second orientation.

18. The cable management system of claim 16, wherein the cable bar has first and second legs each including a mounting flange having a leg opening, and wherein the first and second support brackets each include an attachment flange with a bracket opening, the leg openings of the first leg are aligned with the bracket openings of the first and second support brackets in the first orientation, and the leg openings of the second leg are aligned with the bracket openings of the first and second support brackets in the second orientation.

19. The cable management system of claim 16, wherein the cable bar has first and second legs defining an L-shaped cross-section, a longitudinal axis extends along the first and second legs and a transverse axis extends through the first leg, wherein the cable bar is transferred from the first orientation to the second orientation by rotating the cable bar 180 degrees about the longitudinal axis and 90 degrees about the transverse axis.

20. The cable management system of claim 16, wherein the equipment rack has a rear interface, the tie down slot of the cable bar is substantially perpendicular to the rear interface in the first orientation and the tie down slot of the cable bar is substantially parallel to the rear interface in the second orientation.

* * * * *